United States Patent
Wu

(10) Patent No.: US 8,269,556 B2
(45) Date of Patent: Sep. 18, 2012

(54) METHOD AND AMPLIFIER FOR CANCELLING MAGNETIC COUPLING

(75) Inventor: Pi-An Wu, Taipei (TW)

(73) Assignee: Ralink Technology Corp., Jhubei, Hsinchu County (TW)

( * ) Notice: Subject to any disclaimer, the term of this patent is extended or adjusted under 35 U.S.C. 154(b) by 0 days.

(21) Appl. No.: 13/004,897

(22) Filed: Jan. 12, 2011

(65) Prior Publication Data

US 2011/0193627 A1 Aug. 11, 2011

(30) Foreign Application Priority Data

Feb. 9, 2010 (TW) ................. 99103920 A

(51) Int. Cl.
*H03F 3/68* (2006.01)

(52) U.S. Cl. ...................... 330/124 R; 330/295
(58) Field of Classification Search .............. 330/124 R, 330/295, 84, 252–261
See application file for complete search history.

(56) References Cited

U.S. PATENT DOCUMENTS

2008/0204148 A1* 8/2008 Kim et al. .................. 330/306
* cited by examiner

*Primary Examiner* — Hieu Nguyen
(74) *Attorney, Agent, or Firm* — Winston Hsu; Scott Margo

(57) ABSTRACT

A method for cancelling magnetic coupling in an amplifier is disclosed. The amplifier includes a first path and a second path for outputting a first signal and a second signal, respectively, and the first signal and the second signal have a specific phase difference. The method includes forming a first LC tank and a second LC tank in the first path, and forming a third LC tank and a forth LC tank in the second path.

18 Claims, 11 Drawing Sheets

METHOD AND AMPLIFIER FOR CANCELLING MAGNETIC COUPLING

BACKGROUND OF THE INVENTION

1. Field of the Invention

The present invention relates to a method and amplifier for cancelling magnetic coupling, and more particularly, to a method and amplifier capable of reducing in-phase/quadrature-phase (IQ) phase imbalance and gain imbalance, and minimizing layout area.

2. Description of the Prior Art

In communication systems, a carrier is frequently utilized for carrying baseband signals that contain data. Generally, a carrier is a high frequency signal. However, due to bandwidth limitation, a transmitter adopts a modulation scheme with high bandwidth efficiency. A quadrature amplitude modulation (QAM) is one of frequently utilized modulation schemes.

Generally, in a QAM system, signals are processed in two different paths. Ideally, the incoming signals are multiplied by an in-phase carrier (in-phase carrier) g sin wt and a quadrature-phase carrier g cos wt two mixers for modulation in the two paths, respectively, wherein g is the gain, and w is the angular frequency. In practice, factors such as magnetic coupling between inductors, temperature, process and supply voltage offset may result in gain imbalance and phase imbalance between the in-phase carrier g sin wt and the quadrature-phase carrier g cos wt, i.e. in-phase/quadrature-phase (IQ) imbalance. In other words, the oscillating signals utilized by the mixers may become (g+α)sin wt and g cos(wt+θ), where α is the gain imbalance and θ is the phase imbalance. In such a condition, there will be gain imbalance and phase imbalance between the mixed in-phase signal and the mixed quadrature-phase signal.

For example, please refer to FIG. 1A, which is a schematic diagram of a conventional quadrature amplifier 100. For clearly illustrating, the quadrature amplifier 100 shown in FIG. 1A only includes differential amplifiers 102, 104 and inductors 106, 108, while other components of the quadrature amplifier 100 are not shown. The inductors 106, 108 form inductors of two inductor capacitor (LC) tanks, respectively. The amplifier 102 and the inductor 106 are in an in-phase path (I path), and the amplifier 104 and the inductor 108 are in a quadrature-phase path (Q path), wherein a distance between the inductors 106 and 108 is H. In the quadrature amplifier 100, terminals IN and IP in the in-phase path output an in-phase negative signal S1 and an in-phase positive signal S2, respectively, and terminals QN and QP in the quadrature-phase path output a quadrature-phase negative signal S3 and a quadrature-phase positive signal S4, respectively. Ideally, a phase difference between the in-phase positive signal S2 and the quadrature-phase positive signal S4 is 90 degree. However, in order to keep carrier frequency within a range, inductors are utilized to achieve band-pass effect, and magnetic coupling between inductors may induce magnetic fields and generate corresponding induced currents, causing IQ imbalance.

For example, as shown in FIG. 1B to FIG. 1D, which are schematic diagrams of IQ phase imbalance between the in-phase positive signal S2 and the quadrature-phase positive signal S4 when the inductors 106 and 108 shown in FIG. 1A have different coil winding directions. In FIG. 1B, coil winding directions of the inductors 106 and 108 are clockwise, and thus magnetic field directions are downwards through paper. In such a situation, magnetic coupling between inductors having magnetic fields with a same direction generates induced currents, which shifts the in-phase positive signal S2 and the quadrature-phase positive signal S4 from original solid lines to dotted lines. Take a point A shown in FIG. 1B as an example, ideally, a phase of the in-phase positive signal S2 is 0 degree and a phase of the quadrature-phase positive signal S4 is 90 degree, such that a phase difference in between is 90 degree. However, after being affected by the induced currents generated by magnetic coupling between inductors having magnetic fields with the same direction, the phase of the in-phase positive signal S2 is greater than 0 degree and the phase of the quadrature-phase positive signal S4 is less than 90 degree, such that the phase difference in between is less than 90 degree, causing IQ phase imbalance.

Similarly, in FIG. 1D, coil winding directions of the inductors 106 and 108 are counterclockwise, and thus magnetic field directions are upwards through paper. Magnetic coupling between inductors having magnetic fields with a same direction generates induced currents, which results a phase difference between the in-phase positive signal S2 and the quadrature-phase positive signal S4 less than 90 degree, causing IQ phase imbalance. Similarly, in FIG. 1C, coil winding directions of the inductors 106 and 108 are clockwise and counterclockwise, respectively, and thus magnetic field directions are downwards through paper and upwards through paper, respectively. Take a point C shown in FIG. 1C as an example, after being affected by induced currents generated by magnetic coupling between inductors having magnetic fields with opposite directions, a phase of the in-phase positive signal S2 less than 0 degree and a phase of the quadrature-phase positive signal S4 is greater than 90 degree, such that a phase difference in between is greater than 90 degree, causing IQ phase imbalance.

In the prior art, in order to reduce IQ imbalance caused by magnetic coupling between inductors, the distance H between the inductors 106 and 108 is required to be very long, so as to reduce induced currents. As a result, large layout area is required, and magnetic coupling effect can not be totally eliminated, wherein the issue of IQ imbalance can not be effectively solved. Thus, there is a need for improvement of the prior art.

SUMMARY OF THE INVENTION

It is therefore an objective of the present invention to provide a method and amplifier for cancelling magnetic coupling.

The present invention discloses a method for cancelling magnetic coupling in an amplifier. The amplifier includes a first path and a second path for outputting a first signal and a second signal, respectively. The second signal and the first signal have a specific phase difference. The method includes steps of forming a first inductor capacitor (LC) tank and a second LC tank in the first path; and forming a third LC tank and a fourth LC tank in the second path.

The present invention further discloses an amplifier capable of cancelling internal magnetic coupling between inductors on different paths. The amplifier includes a first path, for outputting a first signal, comprising a first inductor capacitor (LC) tank and a second LC tank; and a second path, for outputting a second signal, comprising a third LC tank and a fourth LC tank, the second signal and the first signal having a specific phase difference.

These and other objectives of the present invention will no doubt become obvious to those of ordinary skill in the art after reading the following detailed description of the preferred embodiment that is illustrated in the various figures and drawings.

DETAILED DESCRIPTION

Figure 2A:
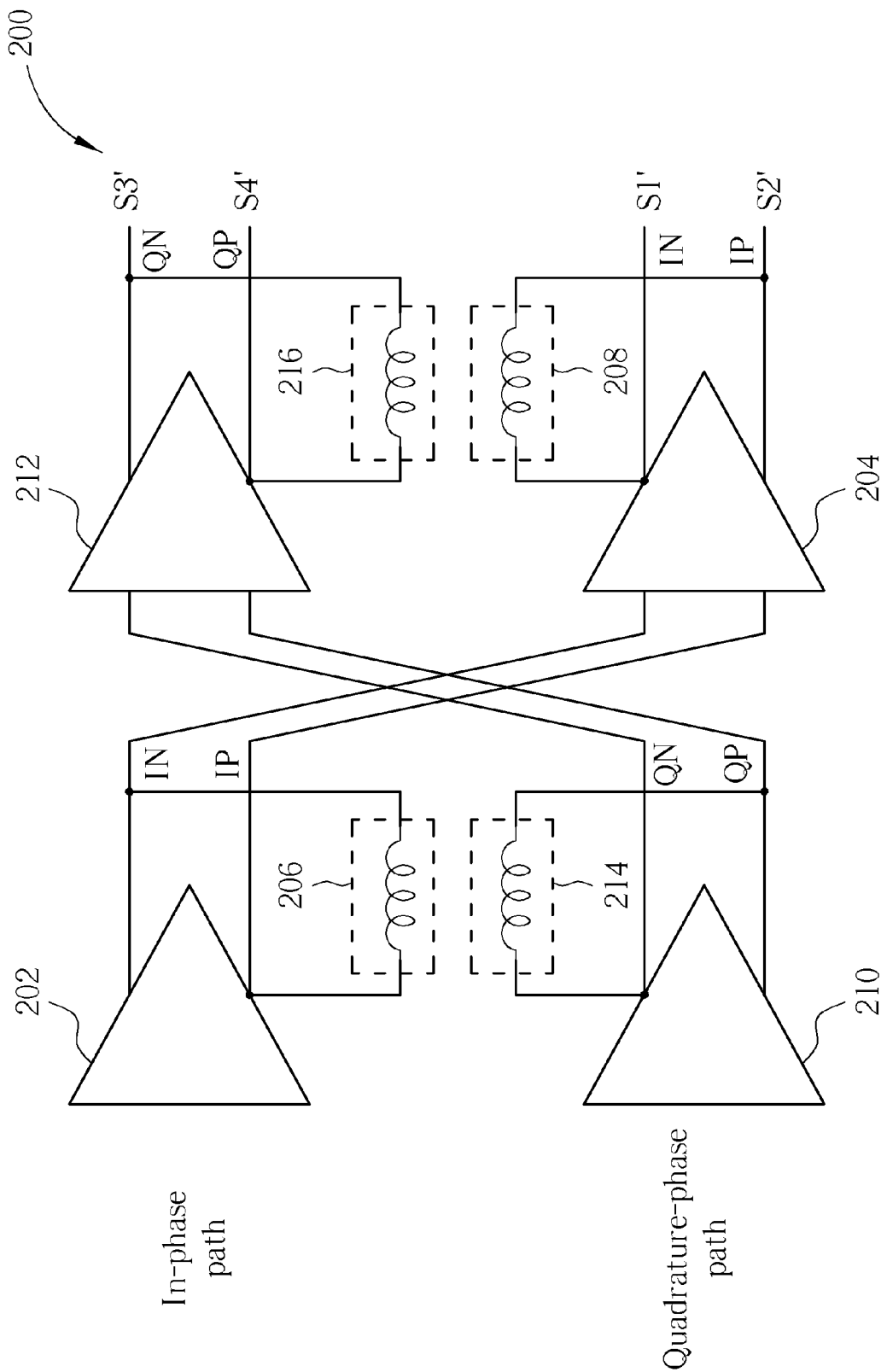
FIG. 2A is a schematic diagram of an amplifier according to an embodiment of the present invention.

Please refer to FIG. 2A, which is a schematic diagram of an amplifier 200 according to an embodiment of the present invention. For simplicity, the amplifier 200 shown in FIG. 2A only includes an in-phase path (I path), for outputting an in-phase negative signal S1' and an in-phase positive signal S2' at a terminal IN and a terminal IP, respectively, and a quadrature-phase path, for outputting a quadrature-phase negative signal S3' and a quadrature-phase positive signal S4' at a terminal QN and a terminal QP, respectively. In detail, the in-phase path includes differential amplifiers 202, 204 and inductors 206, 208. The quadrature-phase path includes differential amplifiers 210, 212 and inductors 214, 216. The inductors 206, 208, 214, 216 form inductors of inductor capacitor (LC) tanks, respectively. The in-phase path and the quadrature-phase path are cross, i.e. the differential amplifiers 202, 212 and the inductors 206, 216 are in parallel with the differential amplifiers 210, 204 and the inductors 214, 208. Noticeably, the amplifier 200 can further include components such as feedback circuit, which is not limited to this, and amplifiers 202, 204, 210, 212 are not limited to differential amplifiers.

Figure 2B:
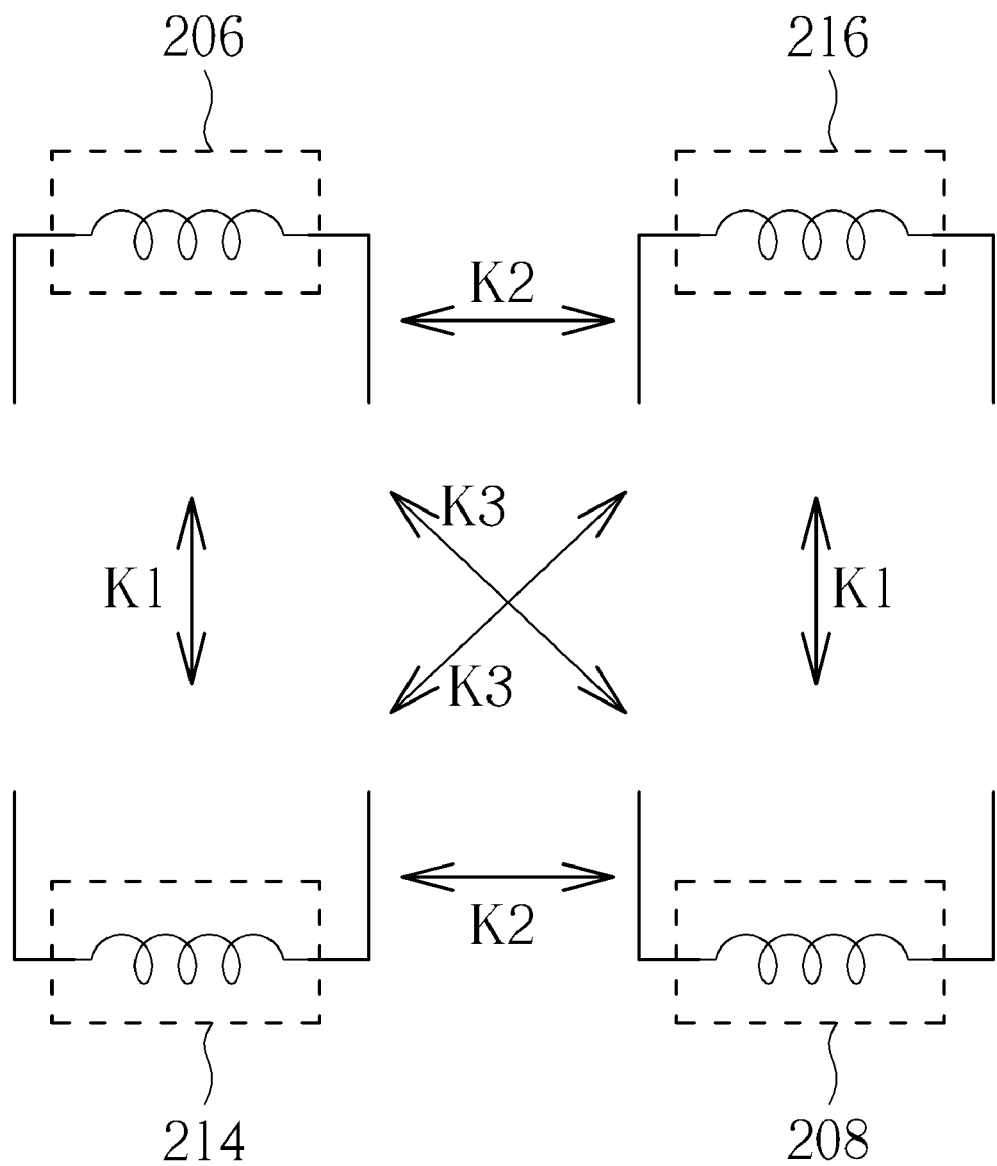
FIG. 2B is a schematic diagram of magnetic coupling between inductors shown in FIG. 2A.

By increasing an amount of LC tanks and adjusting relative positions and coil winding directions, i.e. magnetic field directions, of the inductors 206, 208, 214 and 216 in the amplifier 200, the magnetic coupling between inductors can effective cancelled, so as to reduce IQ imbalance. Thus, a phase difference between the in-phase positive signal S2' and the quadrature-phase positive signal S4' is substantially 90 degree, and layout area is minimized. Please refer to FIG. 2B, which is a schematic diagram of the magnetic coupling between the inductors 206, 208, 214 and 216 shown in FIG. 2A. K1 is a magnetic coupling coefficient between the inductors 206 and 214 or the inductors 208 and 216, K2 is a magnetic coupling coefficient between the inductors 206 and 216 or the inductors 214 and 208, and K3 is a magnetic coupling coefficient between the inductors 206 and 208 or the inductors 214 and 216. Since IQ imbalance between signals with a same phase is small, an effect the magnetic coupling coefficient K3 can be ignored. Therefore, as long as relative distances and the coil winding directions of the inductors 206, 208, 214 and 216 are properly adjusted, induced currents generated by magnetic coupling can be cancelled with each other, so as to reduce IQ imbalance and minimize layout area. For example, by properly adjusting the relative distances and the coil winding directions of the inductors 206, 214 and 216, magnetic coupling the inductor 206 by the magnetic coupling coefficients K1 and K2 has a same magnitude with opposite directions, i.e. induced currents can be cancelled with each other, so as to reduce IQ imbalance, and minimize layout area.

Figure 3A:
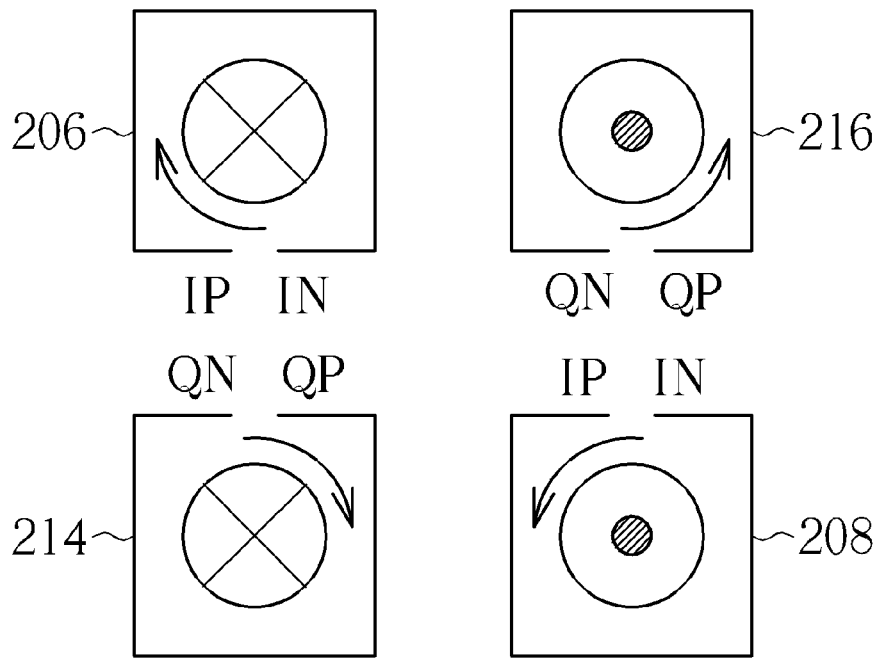
FIG. 3A and FIG. 3B are schematic diagrams of inductors shown in FIG. 2A having different coil winding directions.
Figure 3B:
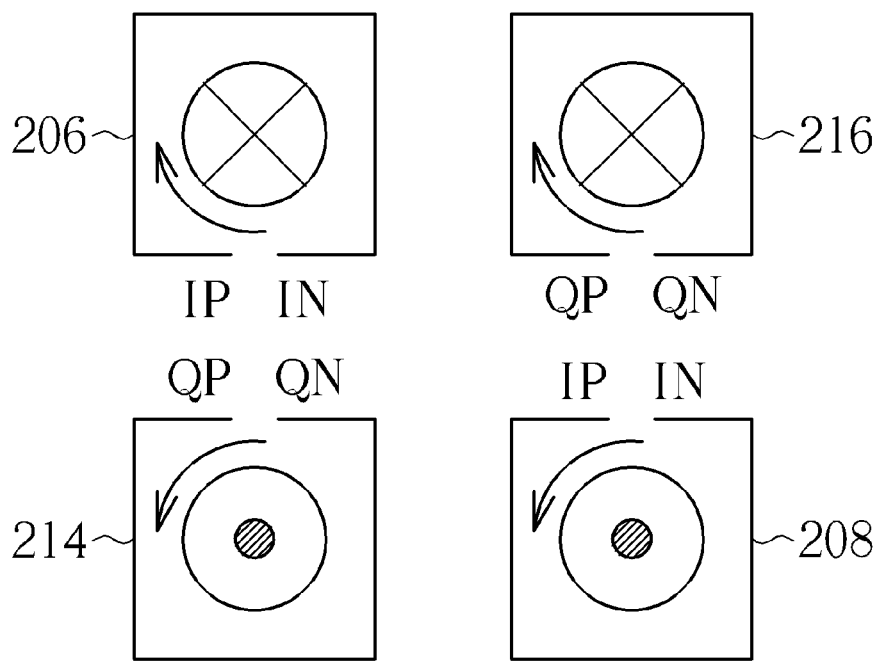

In detail, please refer to FIG. 3A and FIG. 3B, which are schematic diagrams of the inductors 206, 208, 214 and 216 shown in FIG. 2A having different coil winding directions. In FIG. 3A, coil winding directions of the inductors 206 and 214 are clockwise, and thus magnetic field directions thereof are downwards through paper, while coil winding directions of the inductor 208 and 216 are counterclockwise, and thus magnetic field directions thereof are upwards through paper. In such a condition, since IQ imbalance between signals with a same phase is small, the effect the magnetic coupling coefficient K3 can be ignored. Therefore, for the inductor 206, magnetic coupling generated by the inductor 208 can be ignored, and the inductor 214 and inductor 216 can be adjusted to have a same distance with the inductor 206. Therefore, the inductor 214 and inductor 216 can induce magnetic fields on the inductor 206 with a same magnitude but a upwards through paper direction and a downwards through paper direction, respectively, such that corresponding induced currents on the inductor 206 are cancelled with each other. By the same token, induced currents on the inductor 208, 214 and 216 can also be cancelled. As a result, the present invention can adjust induced currents to be cancelled with each other, so as to reduce IQ imbalance, and minimize layout area. Similarly, as shown in FIG. 3B, coil winding directions of the inductor 206 and 216 are clockwise, and thus magnetic field directions are downwards through paper, while coil winding directions of the inductor 208 and 214 are counterclockwise, and thus magnetic field directions are upwards through paper. Therefore, the above effect can also be achieved, and is not narrated hereinafter.

Figure 1A:
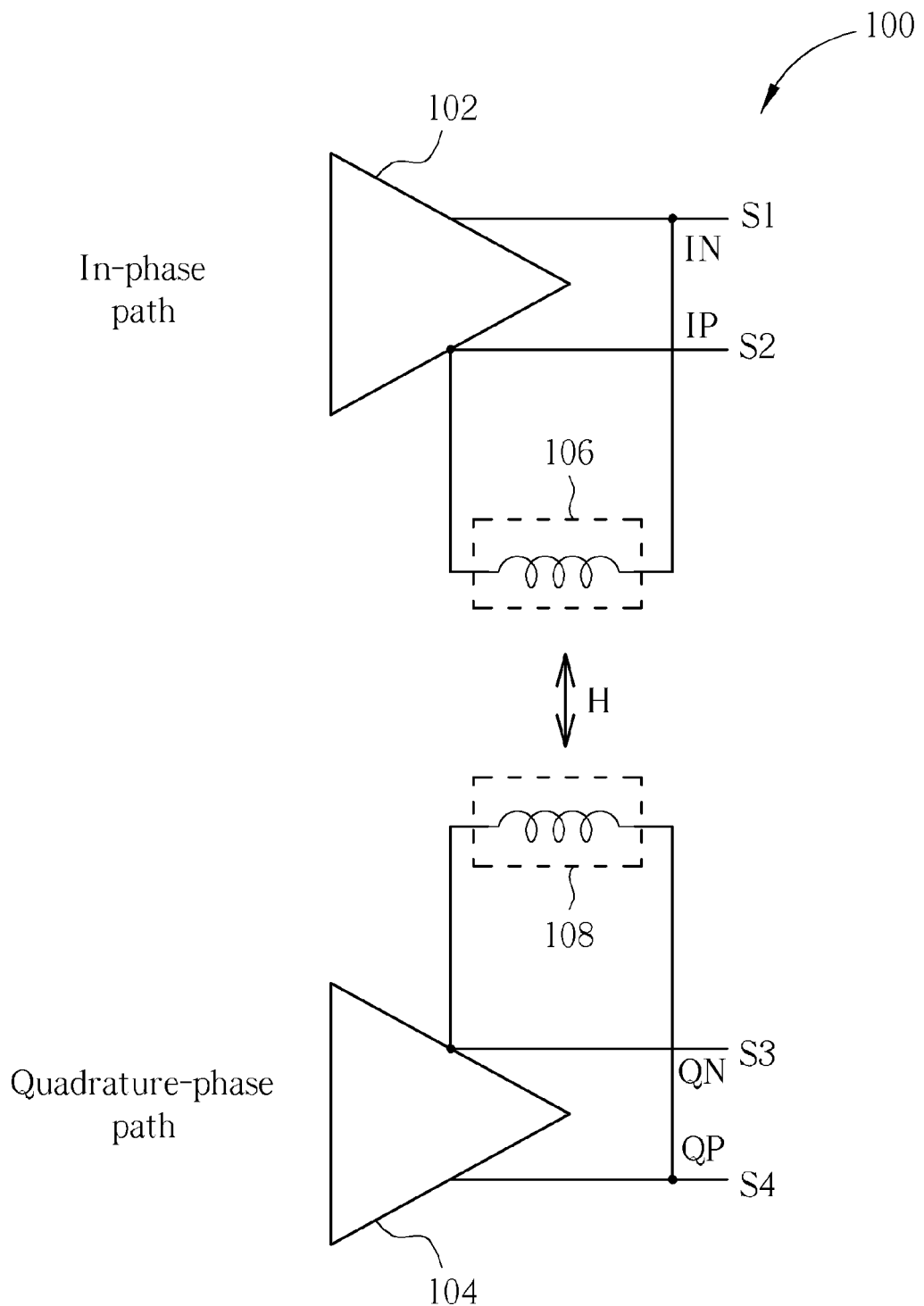
FIG. 1A is a schematic diagram of a conventional quadrature amplifier.
Figure 1B:
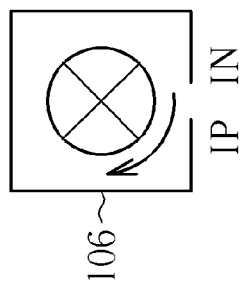
FIG. 1B to FIG. 1D are schematic diagrams of IQ phase imbalance between an in-phase positive signal and a quadrature-phase positive signal when the inductors shown in FIG. 1A have different coil winding directions.
Figure 1B:
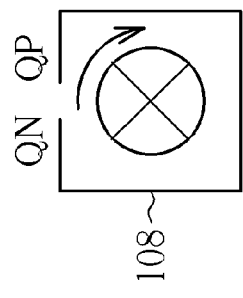
Figure 1B:
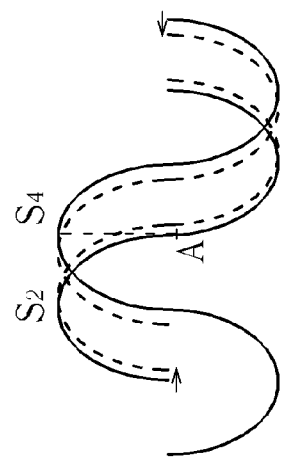
Figure 1C:
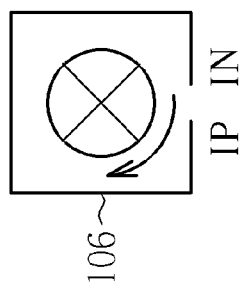
Figure 1C:
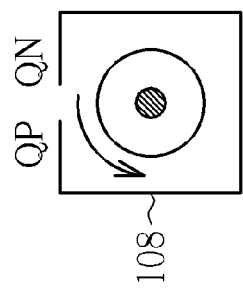
Figure 1C:
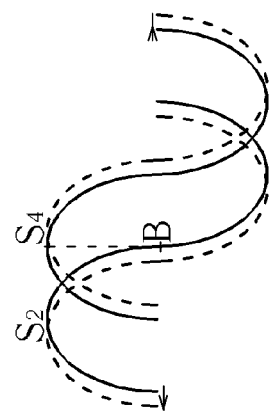
Figure 1D:
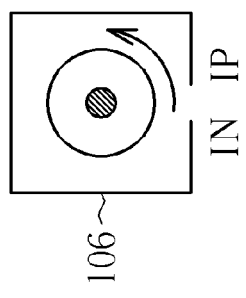
Figure 1D:
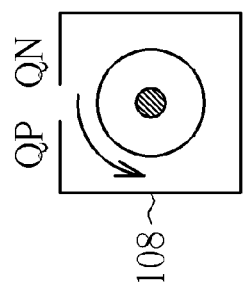
Figure 1D:
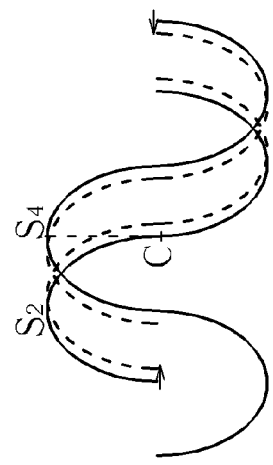
Figure 4A:
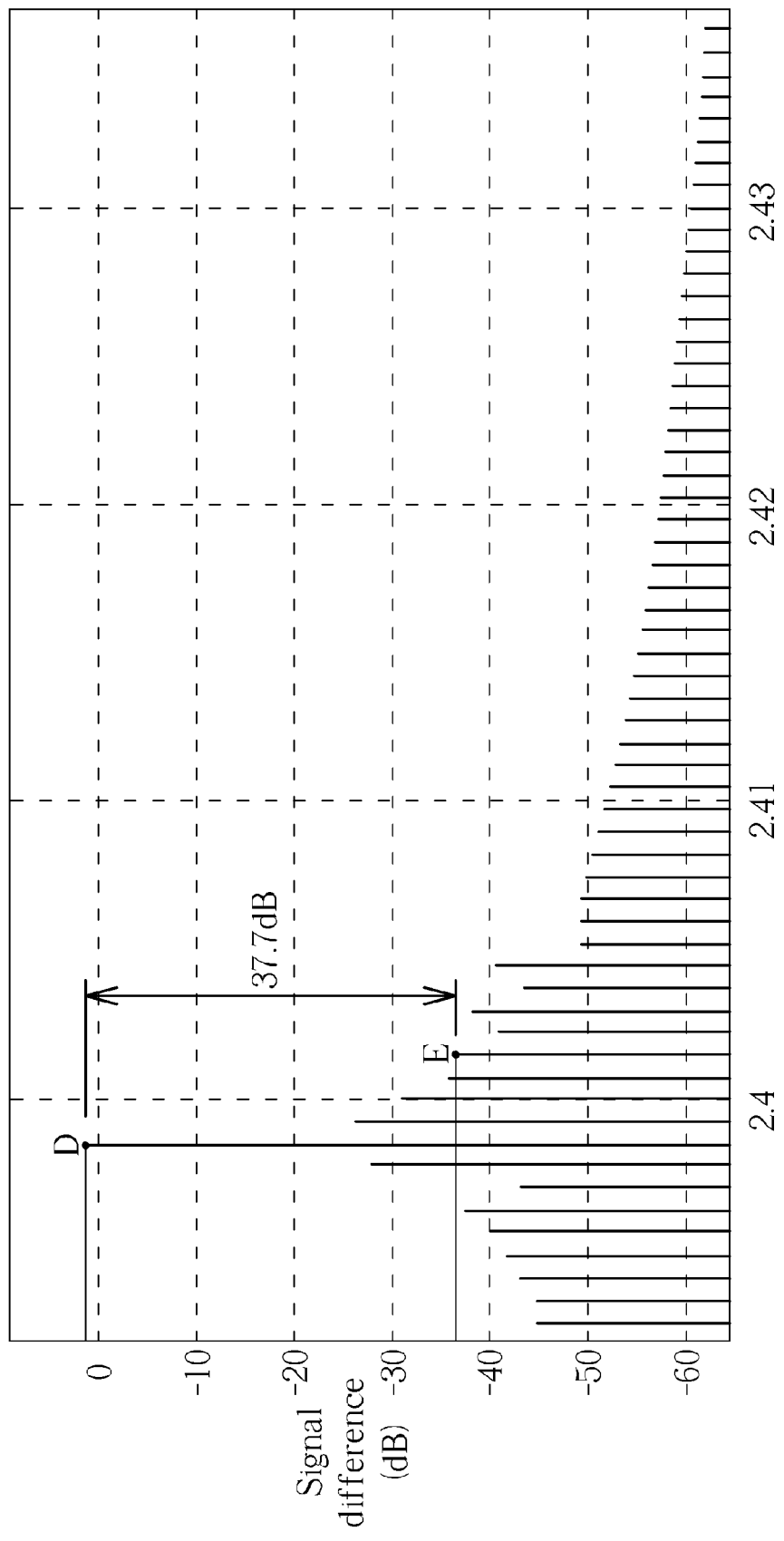
FIG. 4A is a schematic diagram of IQ imbalance magnitude of the quadrature amplifier shown in FIG. 1A.
Figure 4B:
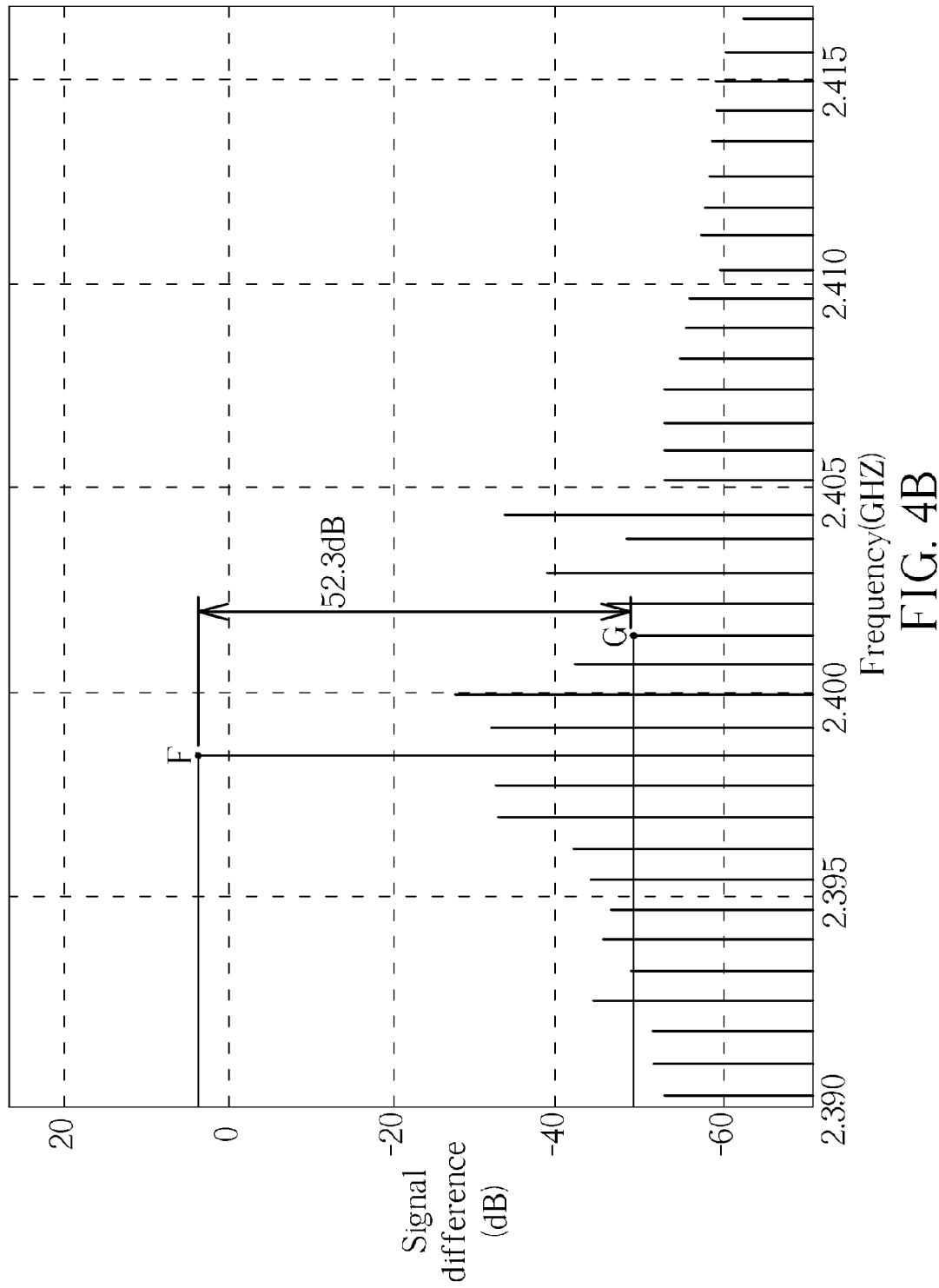
FIG. 4B is a schematic diagram of IQ imbalance magnitude of the amplifier shown in FIG. 2A.

Please refer to FIG. 4A and FIG. 4B. FIG. 4A is a schematic diagram of IQ imbalance magnitude of the quadrature amplifier 100 shown in FIG. 1A. FIG. 4B is a schematic diagram of IQ imbalance magnitude of the amplifier 200 shown in FIG. 2A. FIG. 4A and FIG. 4B are obtained by measuring a difference between in-phase positive signal and quadrature-phase positive signal at different frequencies. Ideally, there are only signals at carrier frequency minus baseband frequency, i.e. points D, F. In practice, IQ imbalance magnitude is obtained by measuring a difference between signals at carrier frequency minus baseband frequency and signals at carrier frequency plus baseband frequency, i.e. points E, G, wherein lower difference indicates worse IQ imbalance. As can be seen from FIG. 4A and FIG. 4B, IQ imbalance magnitude of FIG. 4A is 37.7 dB, and IQ imbalance magnitude of FIG. 4B is 52.3 dB. Therefore, the present invention gain extra 14.6 dB of IQ imbalance magnitude than the prior art. Noticeably, in normal communication systems, IQ imbalance magnitude is required to be higher than 40 dB. As a result, other than adjusting induced currents to be cancelled with each other, so as to reduce IQ imbalance and minimize layout area, the present invention can more comply with requirements of communication systems than the prior art.

Noticeably, the spirit of the present invention is to adjust relative positions and coil winding directions of inductors inside an amplifier, to cancel magnetic coupling between different internal paths, so as to reduce IQ imbalance. Those skilled in the art should make modifications or alterations accordingly which belong to the scope of the present invention. For example, the amplifier 200 is not limited to generate in-phase signals and quadrature-phase signals with 90 degree phase difference, and can to generate signals with other fixed phase differences, such as 45 degree or 135 degree. The amplifier 200 is also not limited to only include the in-phase path and the quadrature-phase path, and can include more than two paths with a specific phase difference. An amount of LC tanks is not limited to four, and can be any amount. All modifications or alterations belong to the scope of the present invention, as long as magnetic coupling between different internal paths can be cancelled by adjusting relative positions and coil winding directions of internal inductors of LC tanks of the amplifier.

In addition, relative positions of the inductors inside the amplifier 200 are not limited to the above description that the in-phase path and the quadrature-phase path are cross. In other embodiments, the in-phase path and the quadrature-phase path can be in parallel as well, which can still cancel magnetic coupling between different internal paths by adjusting relative positions and coil winding directions inside inductors of the amplifier.

Figure 5A:
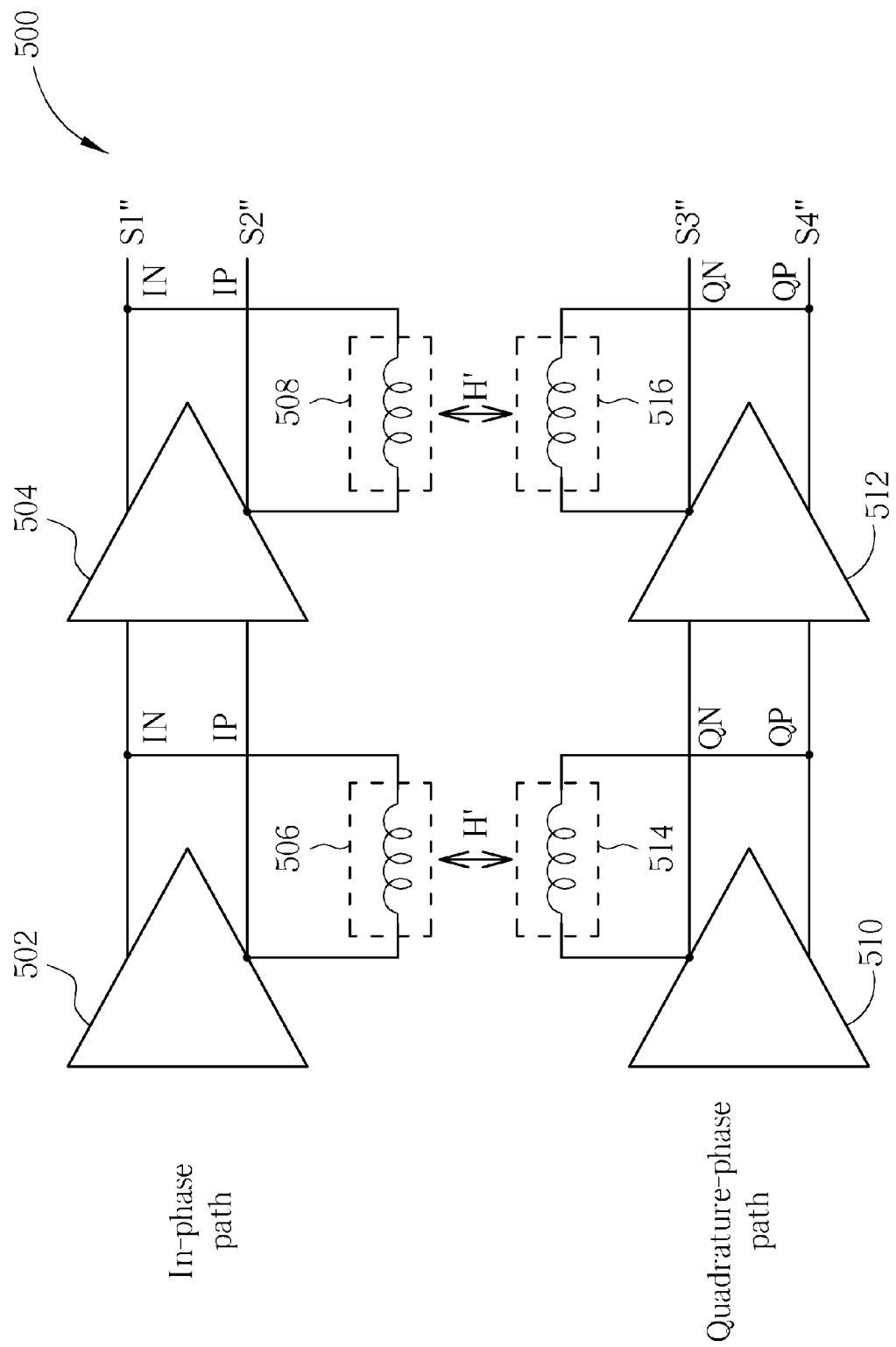
FIG. 5A is a schematic diagram of an amplifier according to another embodiment of the present invention.
Figure 5B:
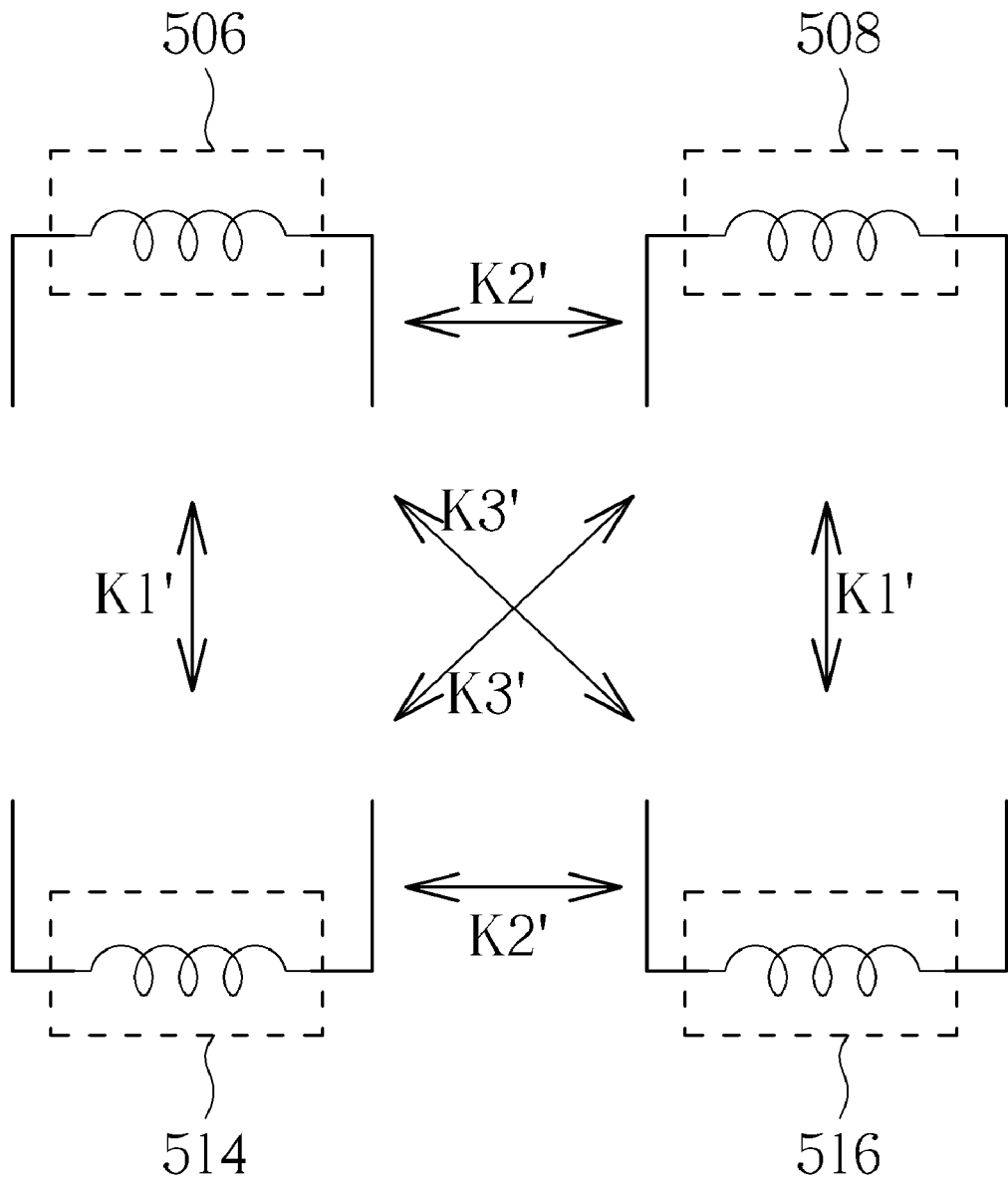
FIG. 5B is a schematic diagram of magnetic coupling between inductors shown in FIG. 5A.

For example, please refer to FIG. 5A and FIG. 5B. FIG. 5A is a schematic diagram of an amplifier 500 according to an embodiment of the present invention. A difference between the amplifier 500 and the amplifier 200 is that the amplifier 500 the in-phase path and the quadrature-phase path are in parallel, i.e. differential amplifiers 502, 504 and inductors 506, 508 are in parallel with differential amplifiers 510, 512 and inductors 514, 516. Operating principles of the amplifier 500 are similar to those of the amplifier 200, and are not narrated hereinafter. FIG. 5B is a schematic diagram of magnetic coupling between inductors 506, 508, 514 and 516 shown in FIG. 5A. K1' is a magnetic coupling coefficient between the inductors 506 and 514 or the inductors 508 and 516, K2' is a magnetic coupling coefficient between the inductors 506 and 508 or the inductors 514 and 516, and K3' is a magnetic coupling coefficient between the inductors 506 and 516 or the inductors 514 and 508. K1', K2' and K3' are magnetic coupling coefficients between inductors, respectively. In such a condition, since IQ imbalance between signals with a same phase is small, an effect the magnetic coupling coefficient K2' can be ignored. Therefore, as long as relative distances and the coil winding directions of the inductors 506, 508, 514 and 516 are properly adjusted, induced currents generated by magnetic coupling can be cancelled with each other, so as to reduce IQ imbalance.

Figure 6A:
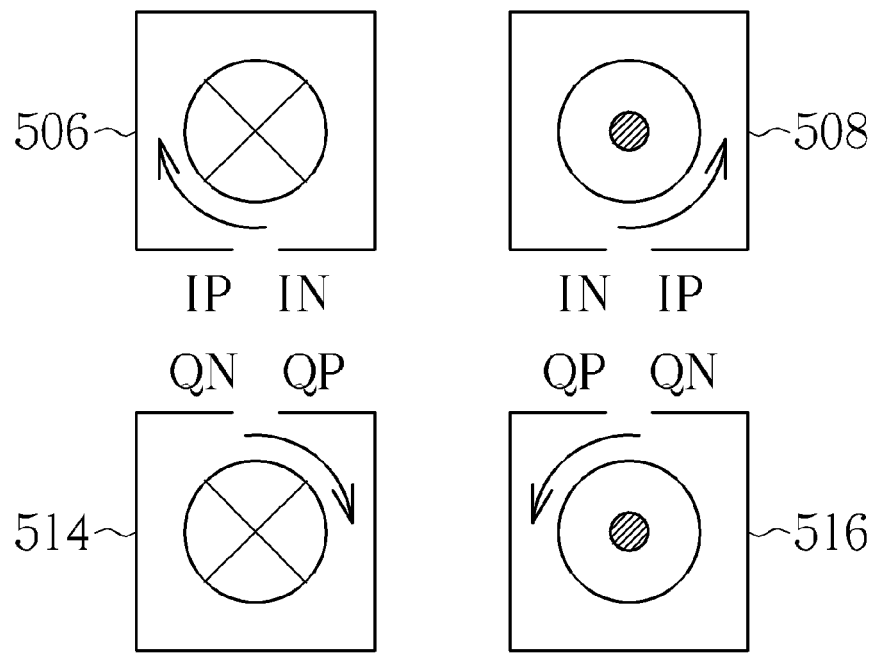
FIG. 6A and FIG. 6B are schematic diagrams of inductors shown in FIG. 5A having different coil winding directions.
Figure 6B:
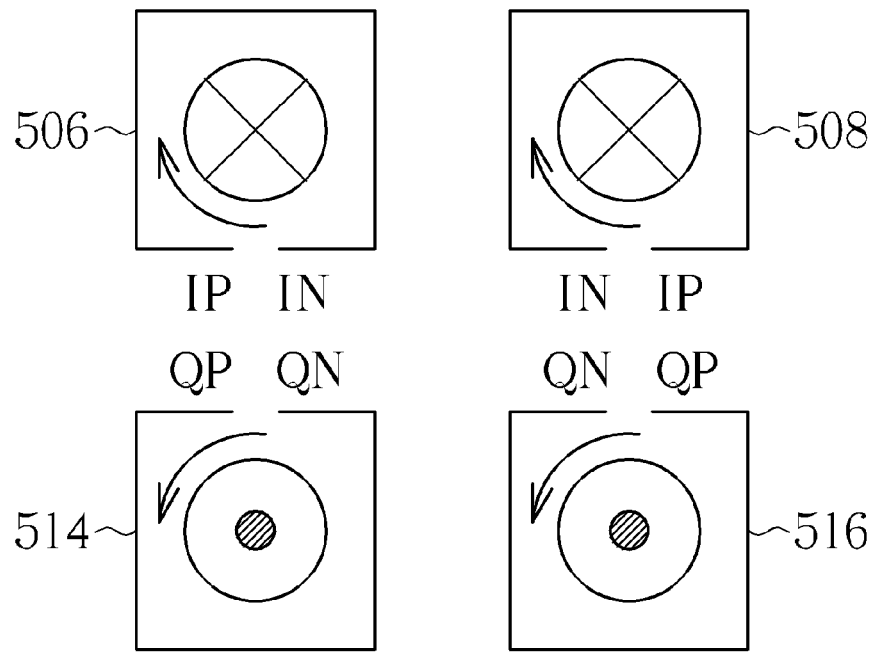

Please continue to refer to FIG. 6A and FIG. 6B, which are schematic diagrams of the inductors 506, 508, 514 and 516 shown in FIG. 5A having different coil winding directions. In FIG. 6A, coil winding directions of the inductors 506 and 514 are clockwise, and thus magnetic field directions are downwards through paper, while coil winding directions of the inductors 508 and 516 are counterclockwise, and thus magnetic field directions are upwards through paper. In such a condition, since IQ imbalance between signals with a same phase is small, the effect the magnetic coupling coefficient K2' can be ignored. Therefore, in order to make the magnetic coupling coefficients K1' and K3' to be cancelled with each other, the inductors 506, 508, 514 and 516 can be arranged corresponding to four vertices of a rhombus or a distance H' between the inductors 506, 514 can be lengthened, to induce magnetic fields with a same magnitude but opposite directions, such that corresponding induced currents are cancelled with each other. Similarly, FIG. 6B is another schematic diagram of coil winding directions, and is similar to the above description.

Figure 7:
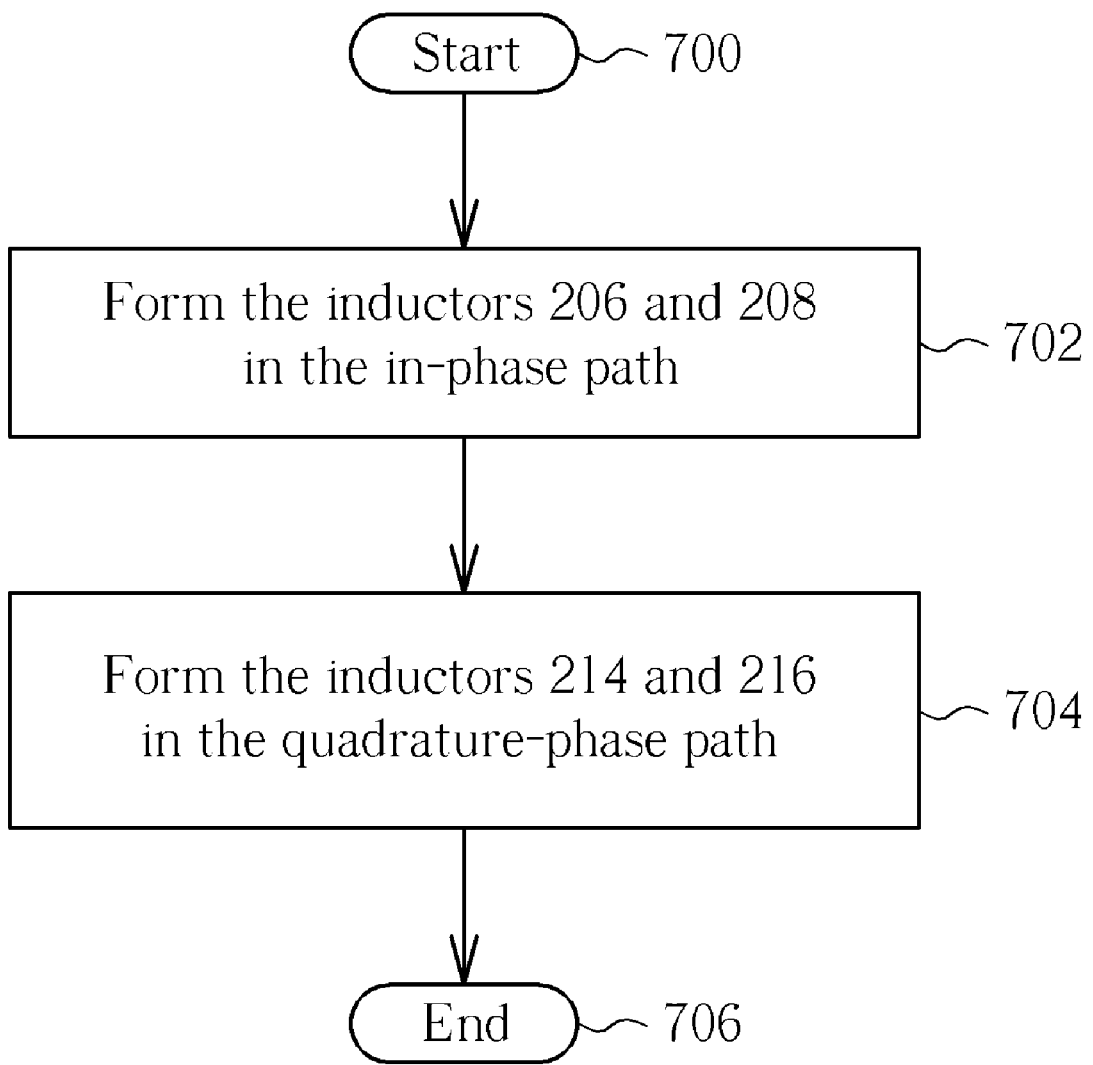
FIG. 7 is a schematic diagram of a process according to an embodiment of the present invention.

Therefore, a method for the amplifier 200 to cancel magnetic coupling can be summarized into is a process 70. As shown in FIG. 7, the process 70 includes following steps:

Step 700: Start.

Step 702: Form the inductors 206 and 208 in the in-phase path.

Step 704: Form the inductors 214 and 216 in the quadrature-phase path.

Step 706: End.

Noticeably, the inductors 206, 208, 214, 216 form inductors of LC tanks, respectively. By adjusting the relative distances and the coil winding directions of the inductors 206, 208, 214 and 216, induced currents on the inductors generated by magnetic coupling can be cancelled with each other. Detailed description can be derived by referring the above description, and is not narrated hereinafter.

In the prior art, a distance between an in-phase path and a quadrature-phase path has to be lengthened, to reduce induced currents, so as to reduce IQ imbalance. In comparison, the present invention increases an amount of LC tanks on the in-phase path and the quadrature-phase path, respectively, and then adjusts relative distances and coil winding directions of inductors of the LC tanks. Therefore, induced magnetic fields on the inductors can be cancelled with each other, to reduce induced currents, and thus reduce IQ imbalance. As a result, the present invention can reduce IQ imbalance with small layout area.

To sum up, the present invention cancels magnetic coupling by increasing and adjusting LC tanks, and thus can effectively reduce IQ imbalance with small layout area.

Those skilled in the art will readily observe that numerous modifications and alterations of the device and method may be made while retaining the teachings of the invention.

What is claimed is:

1. A method for cancelling magnetic coupling in an amplifier, the amplifier comprising a first path and a second path for outputting a first signal and a second signal, respectively, the second signal and the first signal having a quadrature phase relationship, the method comprising:

forming a first inductor of a first inductor capacitor (LC) tank and a second inductor of a second LC tank in the first path; and forming a third inductor of a third LC tank and a forth inductor of a fourth LC tank in the second path.

2. The method of claim 1, wherein the first LC tank, the second LC tank, the third LC tank and the fourth LC tank output positive and negative signals.

3. The method of claim 1, wherein the first LC tank and the fourth LC tank are in parallel with the second LC tank and the third LC tank.

4. The method of claim 3, wherein winding directions of inductors of the first LC tank and the third LC tank are clockwise, and winding directions of inductors of the second LC tank and the fourth LC tank are counterclockwise.

5. The method of claim 3, wherein winding directions of inductors of the first LC tank and the fourth LC tank are clockwise, and winding directions of inductors of the second LC tank and the third LC tank are counterclockwise.

6. The method of claim 1, wherein the first LC tank and the second LC tank are in parallel with the third LC tank and the fourth LC tank.

7. The method of claim 6, wherein the first LC tank, the second LC tank, the third LC tank and the fourth LC tank are arranged corresponding to four vertices of a rhombus.

8. The method of claim 6, wherein winding directions of inductors of the first LC tank and the third LC tank are clockwise, and winding directions of inductors of the second LC tank and the fourth LC tank are counterclockwise.

9. The method of claim 6, wherein winding directions of inductors of the first LC tank and the fourth LC tank are clockwise, and winding directions of inductors of the second LC tank and the third LC tank are counterclockwise.

10. An amplifier, capable of cancelling internal magnetic coupling between inductors on different paths, the amplifier comprising:
   a first path, for outputting a first signal, comprising a first inductor of a first inductor capacitor (LC) tank and a second inductor of a second LC tank; and
   a second path, for outputting a second signal, comprising a third inductor of a third LC tank and a forth inductor of a fourth LC tank, the second signal and the first signal having a quadrature phase relationship.

11. The amplifier of claim 10, wherein the first LC tank, the second LC tank, the third LC tank and the fourth LC tank outputs positive and negative signals.

12. The amplifier of claim 10, wherein the first LC tank and the fourth LC tank are in parallel with the second LC tank and the third LC tank.

13. The amplifier of claim 12, wherein winding directions of inductors of the first LC tank and the third LC tank are clockwise, and winding directions of inductors of the second LC tank and the fourth LC tank are counterclockwise.

14. The amplifier of claim 12, wherein winding directions of inductors of the first LC tank and the fourth LC tank are clockwise, and winding directions of inductors of the second LC tank and the third LC tank are counterclockwise.

15. The amplifier of claim 10, wherein the first LC tank and the second LC tank are in parallel with the third LC tank and the fourth LC tank.

16. The amplifier of claim 15, wherein the first LC tank, the second LC tank, the third LC tank and the fourth LC tank are arranged corresponding to four vertices of a rhombus.

17. The amplifier of claim 15, wherein winding directions of inductors of the first LC tank and the third LC tank are clockwise, and winding directions of inductors of the second LC tank and the fourth LC tank are counterclockwise.

18. The amplifier of claim 15, wherein winding directions of inductors of the first LC tank and the fourth LC tank are clockwise, and winding directions of inductors of the second LC tank and the third LC tank are counterclockwise.

* * * * *